(12) United States Patent
Luce et al.

(10) Patent No.: US 8,211,728 B2
(45) Date of Patent: Jul. 3, 2012

(54) HORIZONTAL MICRO-ELECTRO-MECHANICAL-SYSTEM SWITCH

(75) Inventors: Stephen E. Luce, Underhill, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 12/632,836

(22) Filed: Dec. 8, 2009

(65) Prior Publication Data

US 2010/0243414 A1  Sep. 30, 2010

Related U.S. Application Data

(60) Provisional application No. 61/163,893, filed on Mar. 27, 2009.

(51) Int. Cl.
*H01L 21/00* (2006.01)
(52) U.S. Cl. ............................................. 438/48; 257/415
(58) Field of Classification Search .................... 438/48, 438/52; 257/415
See application file for complete search history.

(56) References Cited

U.S. PATENT DOCUMENTS

| | | | |
|---|---|---|---|
| 5,578,976 A | 11/1996 | Yao | |
| 6,127,812 A | 10/2000 | Ghezzo et al. | |
| 6,603,591 B2 | 8/2003 | Mori | |
| 6,605,043 B1 | 8/2003 | Dreschel et al. | |
| 6,621,134 B1 | 9/2003 | Zurn | |
| 6,872,984 B1 | 3/2005 | Leung | |
| 6,953,985 B2 * | 10/2005 | Lin et al. ........................ | 257/659 |
| 7,109,641 B2 | 9/2006 | Park | |
| 7,145,213 B1 * | 12/2006 | Ebel et al. ..................... | 257/414 |
| 7,187,489 B2 | 3/2007 | Miles | |
| 7,259,449 B2 | 8/2007 | Floyd | |
| 7,265,429 B2 | 9/2007 | Wan | |
| 7,348,870 B2 | 3/2008 | Hsu et al. | |
| 7,352,995 B2 | 4/2008 | Pasternak | |
| 7,982,558 B2 * | 7/2011 | Sworowski et al. .......... | 333/186 |
| 8,030,111 B2 * | 10/2011 | Wu et al. ......................... | 438/50 |
| 8,114,699 B2 * | 2/2012 | Wu et al. | |
| 2003/0015768 A1 | 1/2003 | Bosco et al. | |
| 2008/0060919 A1 | 3/2008 | Nakanishi | |
| 2010/0207216 A1 * | 8/2010 | Drews et al. .................. | 257/415 |

* cited by examiner

*Primary Examiner* — Thao Le
(74) *Attorney, Agent, or Firm* — Scully, Scott, Murphy & Presser, P.C.; Anthony J. Canale

(57) ABSTRACT

A first dielectric material layer and a second dielectric material layer are formed on a substrate. Three conductive portions are formed within the second dielectric material layer. An optional third dielectric material layer and an optional dielectric capping layer may be formed over the three conductive portions. Portions of the second dielectric material layer and the first dielectric material layer are removed from within an area of a hole in a masking layer. The first dielectric material layer is laterally undercut to provide a micro-electro-mechanical-system (MEMS) switch comprising a conductive cantilever, a conductive plate, and a conductive actuator from the three conductive portions as portions of the first and second dielectric material layers are removed. The MEMS switch may be employed to provide mechanical switchable contact between the conductive cantilever and the conductive plate through an electrical signal on the conductive actuator.

25 Claims, 11 Drawing Sheets

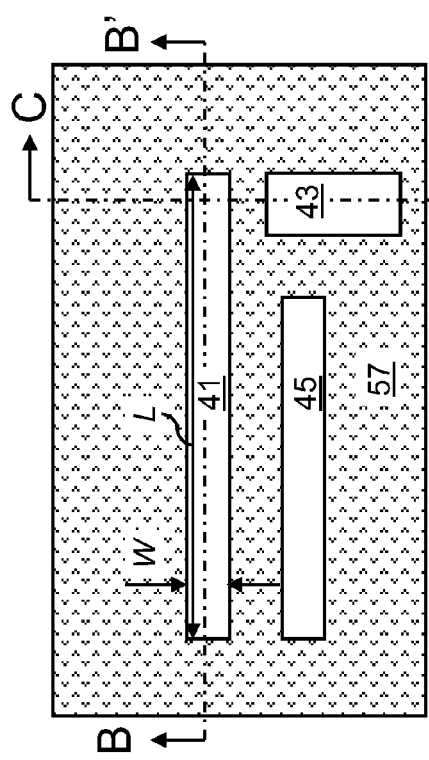
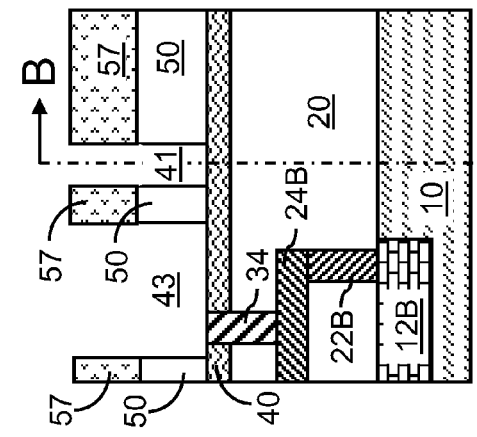
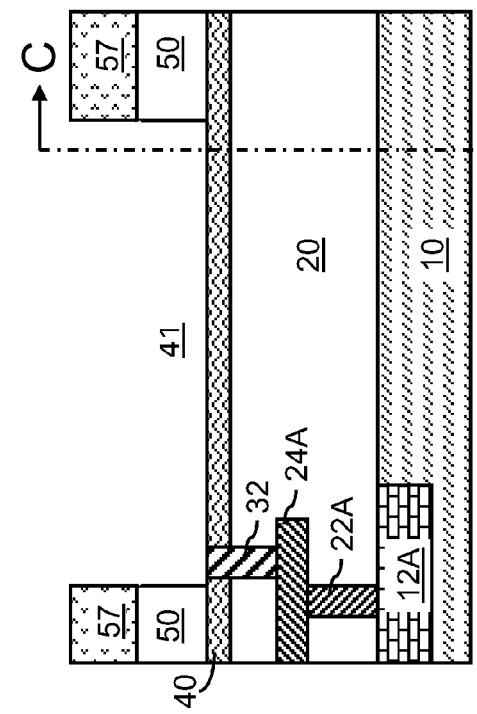
FIG. 3A
FIG. 3B
FIG. 3C

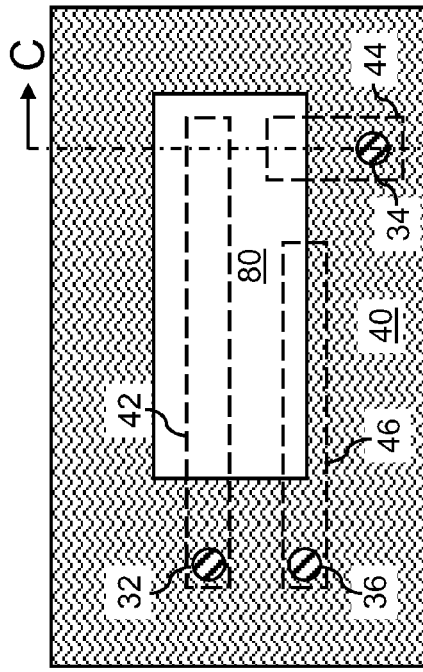
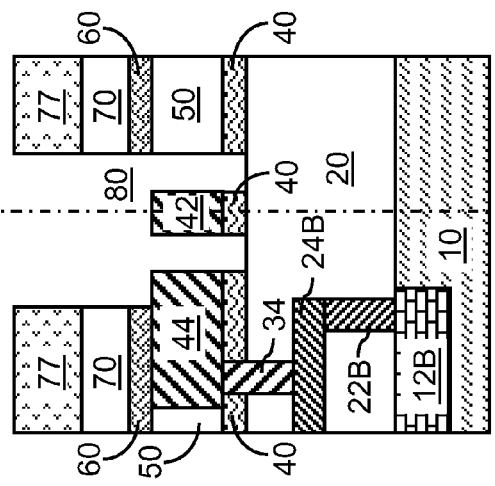
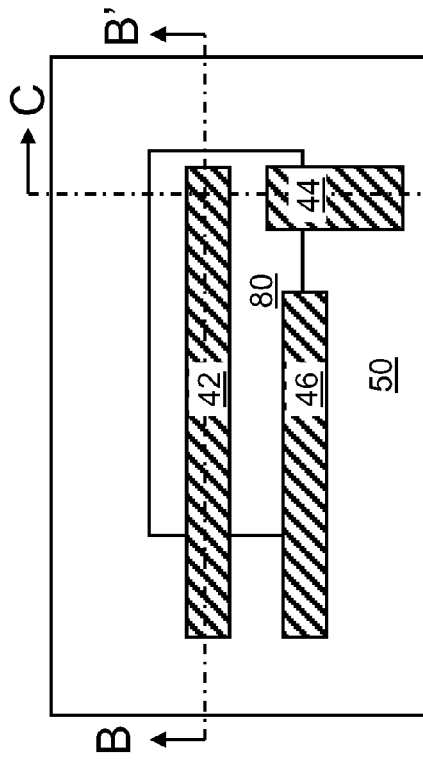
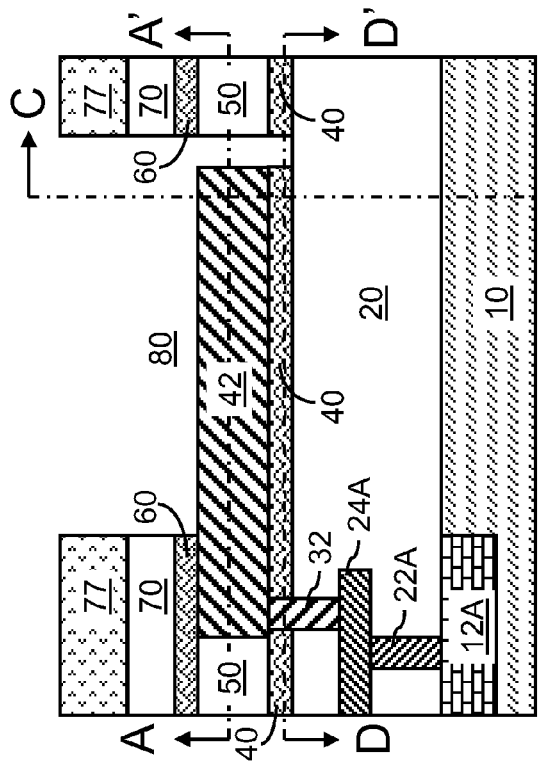

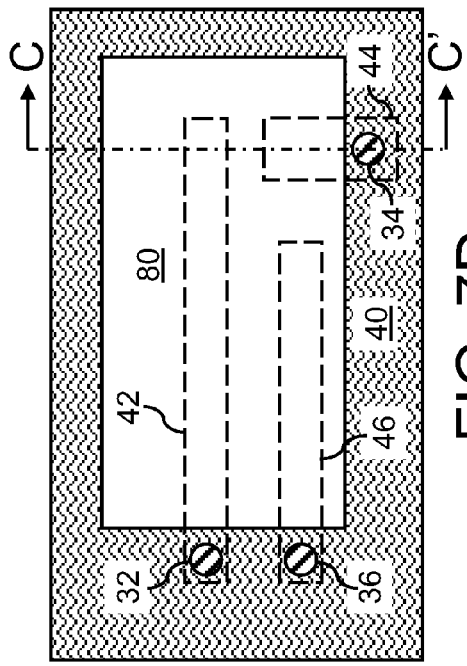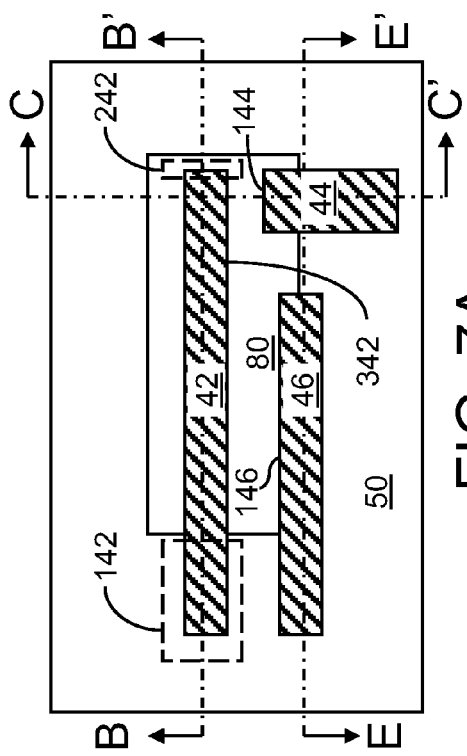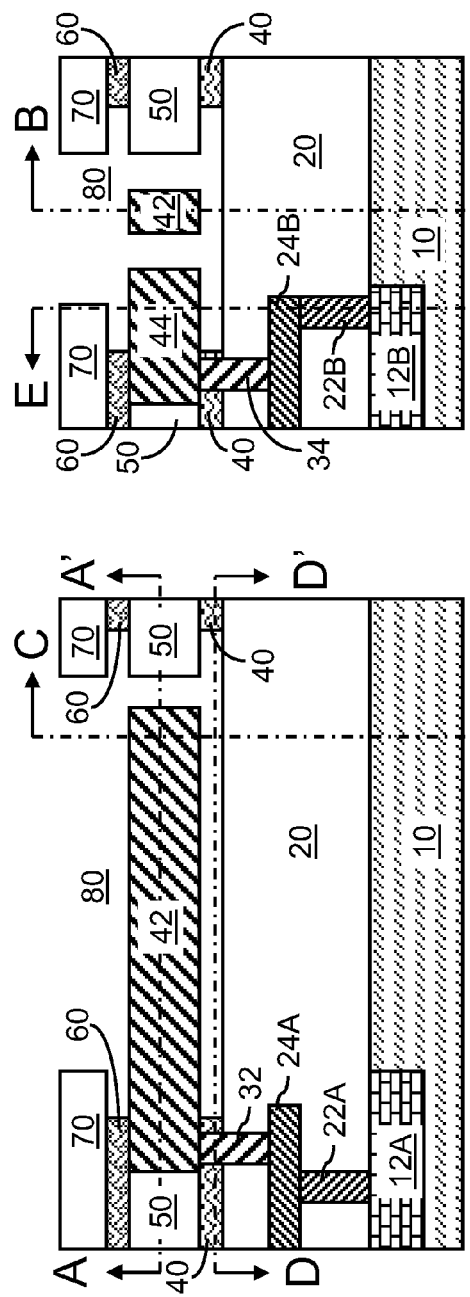

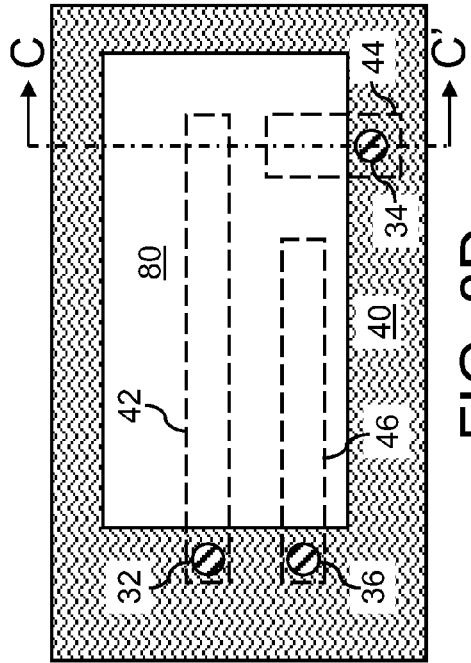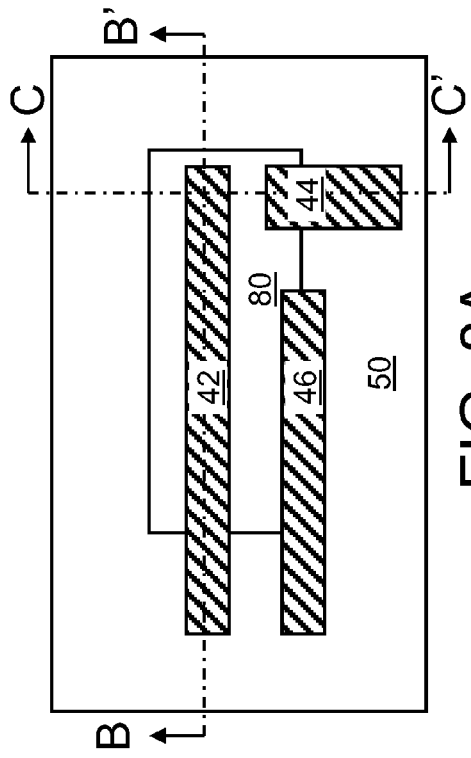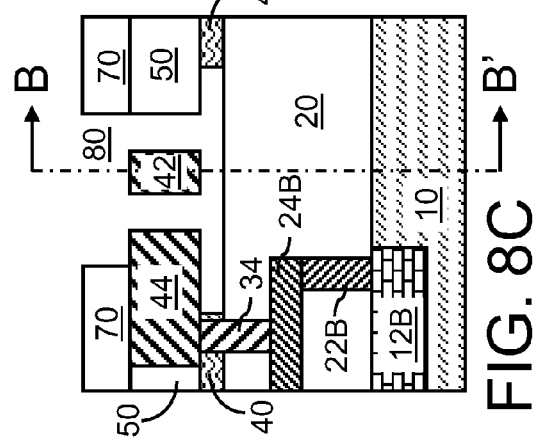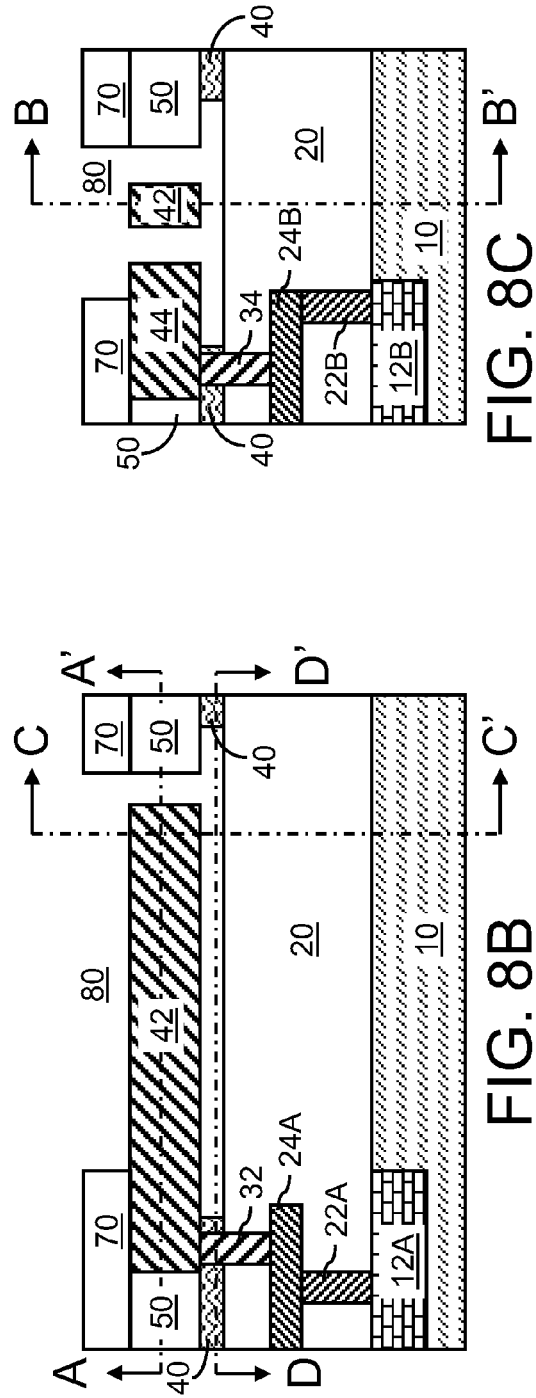

HORIZONTAL MICRO-ELECTRO-MECHANICAL-SYSTEM SWITCH

FIELD OF THE INVENTION

The present invention relates to a horizontal micro-electro-mechanical-system (MEMS) switch, and particularly to a horizontal MEMS switch that may be integrated with semiconductor devices, methods of manufacturing the same, and methods of operating the same.

BACKGROUND OF THE INVENTION

Micro-electro-mechanical-system (MEMS) devices provide useful functions of converting electrical signals into microscopic mechanical movements or vice versa. Typically, the dimensions of MEMS devices are measured in units of microns, e.g., from about 1 micron to about 1,000 microns. By coupling electrical signals with microscopic mechanical movements, MEMS devices enable novel devices that measure and/or control portions of a mechanical system through electrical or electronic control means. In general, MEMS devices having a simple structure may provide reliable performance and manufacturability, thereby enabling useful functionality in an economical manner.

SUMMARY OF THE INVENTION

The present invention provides a horizontal micro-electro-mechanical-system (MEMS) switch that may be integrated into a semiconductor chip containing semiconductor devices, and methods of manufacturing the same.

In embodiments of the present invention, at least one semiconductor device and metal interconnect structures may be formed on a semiconductor substrate. At least one interconnect-level dielectric layer may be formed over the metal interconnect structures. A first dielectric material layer is formed over the interconnect-level dielectric layer. Conductive contact structures may be formed in the first dielectric material layer. A second dielectric material layer is formed over the first dielectric material layer and lithographically patterned to form a first trench, a second trench, and a third trench. The first through third trenches are filled with a conductive material to form three conductive portions. An optional third dielectric material layer and an optional dielectric capping layer may be formed over the three conductive portions.

Portions of the optional dielectric capping layer, the optional third dielectric material layer, the second dielectric material layer, and the first dielectric material layer are removed from within an area of a hole in a masking layer to form a cavity. The first dielectric material layer is laterally undercut to provide a micro-electro-mechanical-system (MEMS) switch comprising a conductive cantilever, a conductive plate, and a conductive actuator from the three conductive portions. The MEMS switch is formed in the cavity formed within the first and second dielectric material layer. The MEMS switch may be electrically connected to the at least one semiconductor device to provide a mechanical switch for a signal path, which provides superior noise isolation in an off-state than transistor-based electronic switches. Formation of the three conductive portions in the same level simplifies the manufacturing process and reduces manufacturing cost.

According to an aspect of the present invention, a method of forming a micro-electrical-mechanical-system (MEMS) switch is provided, which comprises:

forming a first dielectric material layer on a substrate;
forming a second dielectric material layer directly on a top surface of the first dielectric material layer;
forming a conductive cantilever, a conductive plate, and a conductive actuator within the second dielectric layer;
forming a masking layer including a pattern of a hole therein over the second dielectric material layer;
transferring the pattern in the masking layer into the second dielectric material layer and the first dielectric material layer; and
laterally etching the first dielectric material layer from underneath a portion of the conductive cantilever, wherein the conductive cantilever has a fixed end that is embedded in the second dielectric material layer, a free end that is free to move under an externally applied force, and a conductive cantilever sidewall, wherein the conductive plate is embedded in the second dielectric material layer, is located in proximity to the free end of the conductive cantilever, and includes a conductive plate sidewall, and wherein the conductive actuator is embedded in the second dielectric material layer, is laterally displaced from the conductive cantilever and the conductive plate, wherein the free end of the conductive cantilever is laterally flexible to enable mechanical contact with the conductive plate under electrical bias applied across the conductive actuator and the conductive cantilever.

According to another aspect of the present invention, a method of operating a micro-electrical-mechanical-system (MEMS) switch is provided. The method comprises:

providing a micro-electrical-mechanical-system (MEMS) switch including:
  a first dielectric material layer including a first hole therein and located on a substrate;
  a second dielectric material layer including a second hole therein and located directly on a top surface of the first dielectric material layer;
  a conductive cantilever having a fixed end that is embedded in the second dielectric material layer, a free end that is free to move under an externally applied force, and a conductive cantilever sidewall;
  a conductive plate embedded in the second dielectric material layer and located in proximity to the free end of the conductive cantilever and including a conductive plate sidewall; and
  a conductive actuator embedded in the second dielectric material layer and laterally displaced from the conductive cantilever and the conductive plate; and
applying a voltage bias across the conductive actuator and the conductive cantilever, wherein, wherein the free end of the conductive cantilever is laterally flexed to form a mechanical contact with the conductive plate.

According to yet another aspect of the present invention, a structure is provided, which comprises:

a first dielectric material layer including a first hole therein and located on a substrate;
a second dielectric material layer including a second hole therein and located directly on a top surface of the first dielectric material layer;
a conductive cantilever having a fixed end that is embedded in the second dielectric material layer, a free end that is free to move under an externally applied force, and a conductive cantilever sidewall;
a conductive plate embedded in the second dielectric material layer and located in proximity to the free end of the conductive cantilever and including a conductive plate sidewall; and
a conductive actuator embedded in the second dielectric material layer and laterally displaced from the conductive cantilever and the conductive plate, wherein the free end of the conductive cantilever is laterally flexible to enable mechanical contact with the conductive plate under electrical bias applied across the conductive actuator and the conductive cantilever.

According to still another aspect of the present invention, a design structure embodied in a machine readable medium for designing, manufacturing, or testing a design for a semiconductor structure is provided. The design structure comprises:

a first data representing a substrate;

a second data representing a first dielectric material layer including a first hole therein and located on the substrate;

a third data representing a second dielectric material layer including a second hole therein and located directly on a top surface of the first dielectric material layer;

a fourth data representing a conductive cantilever having a fixed end that is embedded in the second dielectric material layer, a free end that is free to move under an externally applied force, and a conductive cantilever sidewall;

a fifth data representing a conductive plate embedded in the second dielectric material layer and located in proximity to the free end of the conductive cantilever and having a conductive plate sidewall facing the conductive cantilever sidewall including a conductive plate sidewall having a substantially vertical surface; and a sixth representing a conductive actuator embedded in the second dielectric material layer, laterally displaced from the conductive cantilever and the conductive plate, and including a conductive actuator sidewall having a substantially vertical surface, wherein the free end of the conductive cantilever is laterally flexible to enable mechanical contact with the conductive plate sidewall under electrical bias applied across the conductive actuator and the conductive cantilever.

BRIEF DESCRIPTION OF THE DRAWINGS

For all of the figures herein, the following conventions apply. Figures with the same numeric label correspond to the same stage of manufacturing in the same embodiment. Figures with the suffix "A" are top-down views or horizontal cross-sectional views. Figures with the suffix "B" or "C" are vertical cross-sectional views along the plane B-B' or the plane C-C', respectively, of the corresponding figure with the same numeric label and the suffix A. Figures with the suffix "D" are horizontal cross-sectional views along the plane D-D' of the corresponding figure with the same numeric label and the suffix "B.

FIGS. 1A-1C, 2A-2C, 3A-3C, 4A-4C, 5A-5D, 6A-6D, and 7A-7E are various views of a first exemplary structure according to a first embodiment of the present invention at various stages of a manufacturing process.

FIGS. 8A-8D are various views of a second exemplary structure according to a second embodiment of the present invention.

DETAILED DESCRIPTION OF THE INVENTION

Figure 1A:
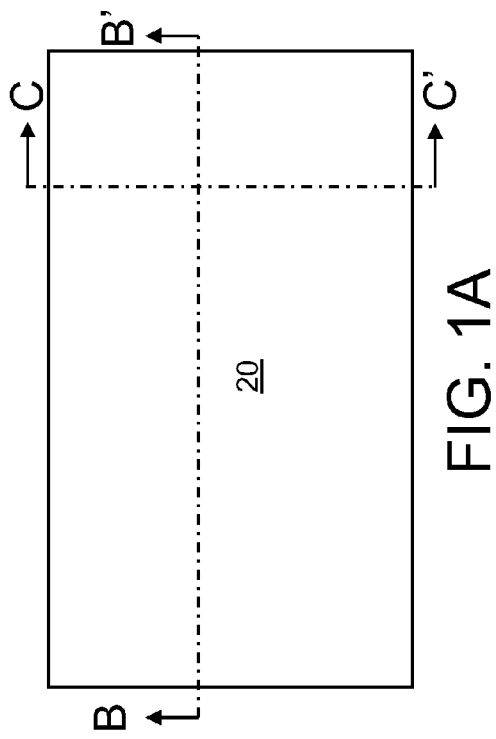

As stated above, the present invention relates to a horizontal micro-electro-mechanical-system (MEMS) switch that may be integrated with semiconductor devices, methods of manufacturing the same, and methods of operating the same, which are described herein with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

As used herein, a structural element is referred to as being "on" another structural element when the structural element is located directly on the other structural element or when a set of at least one intervening element making direct physical contact with the structural element and the other structural element is present. A structural element is referred to as being "directly on" another structural element when there is no intervening structural element and a physical contact is formed between the structural element and the other structural element. Likewise, an element is referred to as being "connected" or "coupled" to another element when the element is directly connected or coupled to the other element or when a set of at least one intervening element provides connection or coupling with the element and the other element. An element is referred to as being "directly connected" or "directly coupled" to another element when there is no intervening element and the connection or coupling is provided between the element and the other element. An element "abuts" another element when a physical interface area providing a direct contact is present between the element and the other element.

Figure 1C:
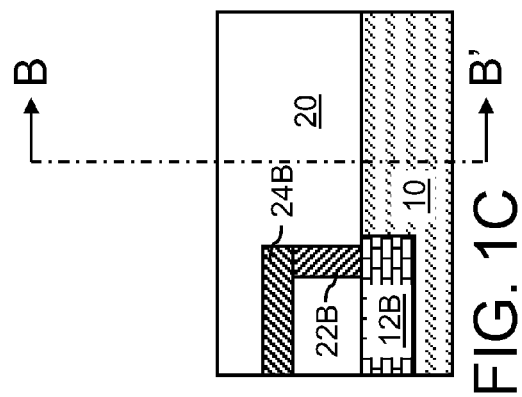
Figure 1B:
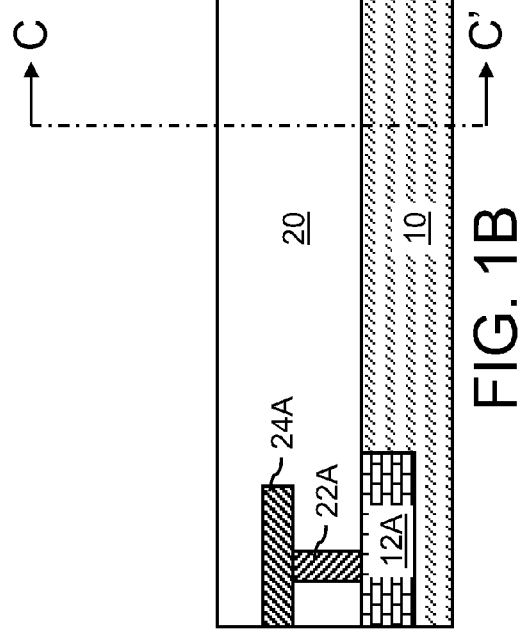

Referring to FIGS. 1A-1C, a first exemplary structure according to a first embodiment of the present invention comprises a substrate, electronic devices therein, and metal interconnect structures. The substrate may be a semiconductor substrate 10 that comprises a semiconductor material. The semiconductor material of the semiconductor substrate 10 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, semiconductor substrate includes a single crystalline semiconductor layer having an epitaxial alignment among atoms within the entirety of the single crystalline semiconductor layer. The semiconductor substrate 10 may be a bulk substrate or a semiconductor-on-insulator (SOI) substrate.

A first semiconductor device 12A, a second semiconductor device 12B, and a third semiconductor device (not shown) may be formed in the semiconductor substrate 10. Preferably, each of the first through third semiconductor devices (12A, 12B) is formed directly on, or in, the single crystalline semiconductor layer. Each of the first through third semiconductor devices (12A, 12B) may include, for example, a metal-oxide-semiconductor field effect transistor (MOSFET) or a bipolar junction transistor (BJT). The first and second semiconductor devices (12A, 12B) may be high frequency signal processing devices that process radio frequency (RF) signals, for example, at a frequency from 10 MHz to 1 THz, although other applications for the first and second semiconductor devices (12A, 12B) are also contemplated herein. The third semiconductor device may be a MOSFET or a BJT that generates a switching control signal to engage or disengage the RF signal path between the first and second semiconductor devices (12A, 12B).

At least one interconnect-level dielectric layer 20 is formed directly on the top surface of the semiconductor substrate 10. The at least one interconnect-level dielectric layer 20 may comprise a single interconnect-level dielectric layer or a plurality of interconnect-level dielectric layers. Each interconnect-level dielectric layer comprises a dielectric material, which may be silicon oxide, silicon nitride, silicon oxynitride, etc. Each interconnect-level dielectric layer may be formed, for example, by chemical vapor deposition or a spin-on coating.

Metal interconnect via structures and metal interconnect line structures may be formed in the at least one interconnect-level dielectric layer 20. The metal interconnect via structures may include at least one first metal interconnect via structure 22A resistively connected to the first semiconductor device 12A, at least one second metal interconnect via structure 22B resistively connected to the second semiconductor device 12B, and at least one third metal interconnect via structure (not shown) resistively connected to the third semiconductor device (not shown). The metal interconnect line structures may include at least one first metal interconnect line structure 24A resistively connected to the first semiconductor device 12A, at least one second metal interconnect line structure 24B resistively connected to the second semiconductor device 12B, and at least one third metal interconnect line structure (not shown) resistively connected to the third semiconductor device (not shown). The metal interconnect via structures (22A, 22B) and metal interconnect line structures (24A, 24B) may comprise Cu, Al, W, WN, Ta, Ti, TiN, TaN, etc.

Figure 2C:
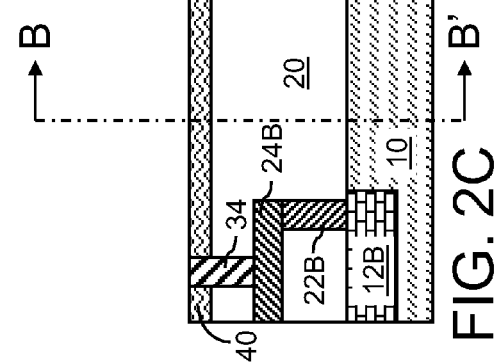
Figure 2A:
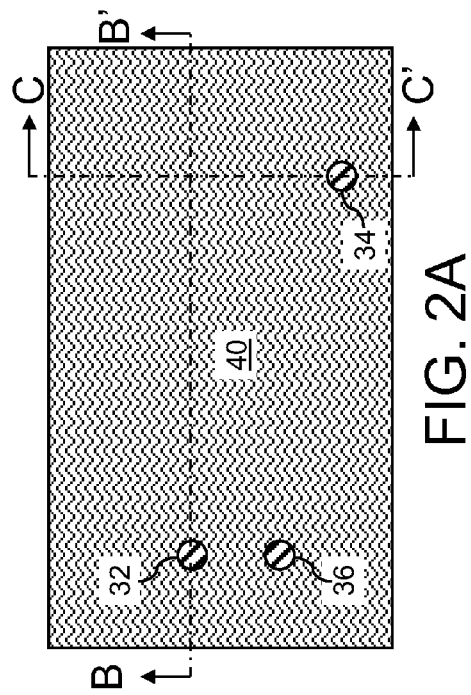
Figure 2B:
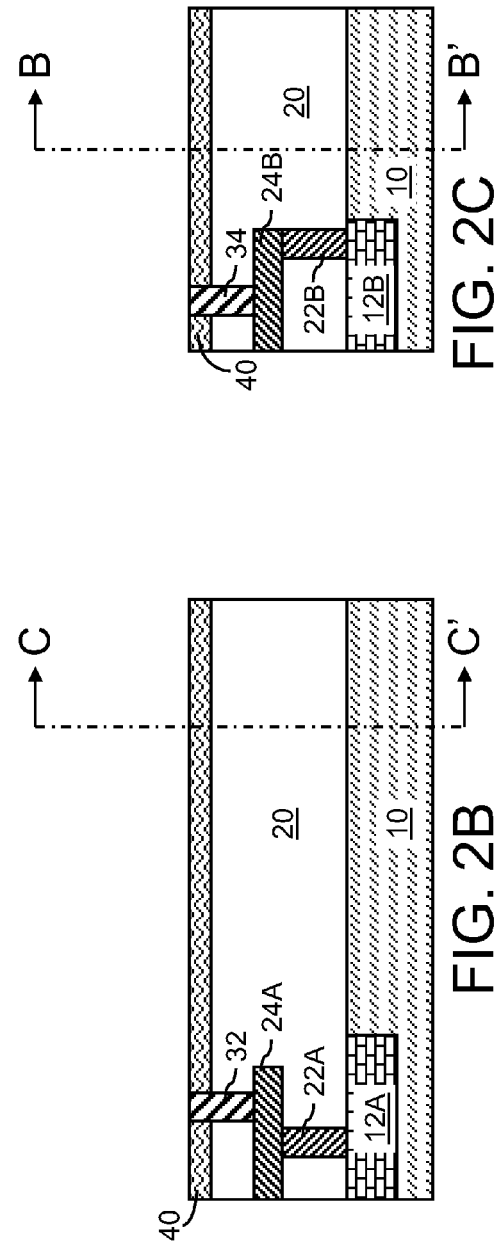

Referring to FIGS. 2A-2C, a first dielectric material layer 40 is formed directly on the top surface of the at least one interconnect level dielectric layer 20. The first dielectric material layer 40 comprises a different material than the material of the topmost surface of the at least one interconnect-level dielectric layer 20. The first dielectric material layer 40 comprises a material that may be removed selective to the material of the topmost surface of the at least one interconnect-level dielectric layer 20.

In some embodiments, the first dielectric material layer 40 comprises a polymer material such as polyimide, Dow Chemical's SiLK™ dielectric, Honeywell's Flare™, polyimides, benzocyclobutene (BCB), polybenzoxazoles, aromatic thermoset polymers based on polyphenylene ethers, and polymethylglutarimide (PMGI). The material of the first dielectric material layer 40 may be porous or non-porous. In other embodiments, the first dielectric material layer 40 comprises a dielectric material selected from an organosilicate glass (OSG), a spin-on glass (SOG) material, a silicon oxide, and a silicon nitride.

The thickness of the first dielectric material layer 40 may be from about 0.2 μm to about 100 μm, and typically from about 2 μm to about 20 μm, although lesser and greater thicknesses are also contemplated herein.

Contact via holes are formed through the first dielectric material layer 40 above the metal interconnect via structures (22A, 22B) and metal interconnect line structures (24A, 24B). If a topmost portions of the metal interconnect via structures (22A, 22B) and metal interconnect line structures (24A, 24B) are located underneath the topmost surface of the a least one interconnect-level dielectric layer 20, the contact via holes are formed through an upper portion of the at least one interconnect-level dielectric layer 20.

A first conductive via structure 32 is formed directly on one of the at least one first metal interconnect line structure 24A and the at least one first metal interconnect via structure 22A. A second conductive via structure 34 is formed directly on one of the at least one second metal interconnect line structure 24B and the at least one second metal interconnect line structure 22B. A third conductive via structure 36 is formed directly on one of the at least one third metal interconnect line structure and the at least one third metal interconnect line structure.

The at least one first metal interconnect via structure 22A, the at least one first metal interconnect line structure 24A, and the first conductive via structure 32 collectively constitute a first metal interconnect structure (22A, 24A, 32). The at least one second metal interconnect via structure 22B, the at least one second metal interconnect line structure 24B, and the second conductive via structure 34 collectively constitute a second metal interconnect structure (22B, 24B, 34). The at least one third metal interconnect line structure, the at least one third metal interconnect line structure, and the third conductive via structure 36 collectively constitute a third metal interconnect structure. The top surfaces of the first, second, and third metal interconnect structures are coplanar with the top surface of the first dielectric layer 40. The first metal interconnect structure abuts the first semiconductor device 12A, the second metal interconnect structure abuts the second semiconductor device 12B, and the third metal interconnect structure abuts the third semiconductor device.

Referring to FIGS. 3A-3C, a second dielectric material layer 50 is formed directly on the top surfaces of the first dielectric material layer 40 and the first, second, and third metal interconnect structures. In case the first dielectric material layer 40 comprises a polymer material, the second dielectric material layer 50 may comprise a non-polymer material such as an organosilicate glass (OSG), a spin-on glass (SOG) material, a silicon oxide, and a silicon nitride. In case the first dielectric material layer 40 comprises one of an organosilicate glass (OSG), a spin-on glass (SOG) material, a silicon oxide, and a silicon nitride, the second dielectric material layer 50 comprises another of an organosilicate glass (OSG), a spin-on glass (SOG) material, a silicon oxide, and a silicon nitride such that the second dielectric material layer 50 comprises a different material from the first dielectric material layer 40. The combination of the materials for the first and second dielectric material layers (40, 50) is selected such that the material of the first dielectric material layer 40 may be removed selective to the material of the second dielectric material layer by an isotropic etch, such as a wet etch.

A first masking layer 57 is formed over the second dielectric material layer 50 and lithographically patterned to form at least three openings. The first masking layer 57 may be a soft mask such as a photoresist layer, or may be a hard mask comprising a dielectric material. In case the first masking layer 57 is a hard mask, the material of the first masking layer 57 is different from the materials of the first and second dielectric material layers (40, 50) to enable selective removal of the first masking layer 57 relative to the first and second dielectric material layers (40, 50).

The at least three openings are transferred into the second dielectric material layer 50 to form a first trench 41, a second trench 43, and a third trench. The first trench 41 is a line trench in the shape of a line such that the length of the line L is greater than the width W of the line. The ratio of the length L to the width W may be from about 5 to 1,000, and preferably from about 10 to 200, although lesser and greater ratios are also contemplated herein. Typically, the width W of the first trench 41 may be a lithographic minimum dimension, and may be from about 50 nm to about 1 μm, although lesser and greater widths are also contemplated herein. While the line trench is described with a rectangular shape herein, non-rectangular shapes for the first trench 41 are also contemplated herein.

The second trench 43 is located in proximity to the first trench 41. A lengthwise edge of the second trench 43 may be parallel to a lengthwise edge of the first trench 41. The distance between the lengthwise edge of the second trench 43 and the lengthwise edge of the first trench 41 may be at or close to a lithographic minimum dimension, and may be from about 50 nm to about 1 μm, although lesser and greater distances are also contemplated herein.

The third trench 45 is formed in proximity to an end portion of the first trench 41. The third trench 45 may be formed on the same side as the third trench 45 of a lengthwise line through the first trench 41 as shown in FIG. 3A, or may be formed on an opposite side of the third trench 45 of the lengthwise line through the first trench 41. Preferably, the third trench 45 is spaced from a lengthwise edge of the first trench 41 by a lithographic minimum dimension, which may be about 50 nm to about 1 μm depending on the lithography tool employed to pattern the first, second, and third trenches (41, 43, 45).

Preferably, top surfaces of the first dielectric layer 40 are exposed underneath the first, second, and third trenches (41, 43, 45). The first masking layer 57 is subsequently removed selective to the first and second dielectric material layers (40, 50).

Figure 4A:
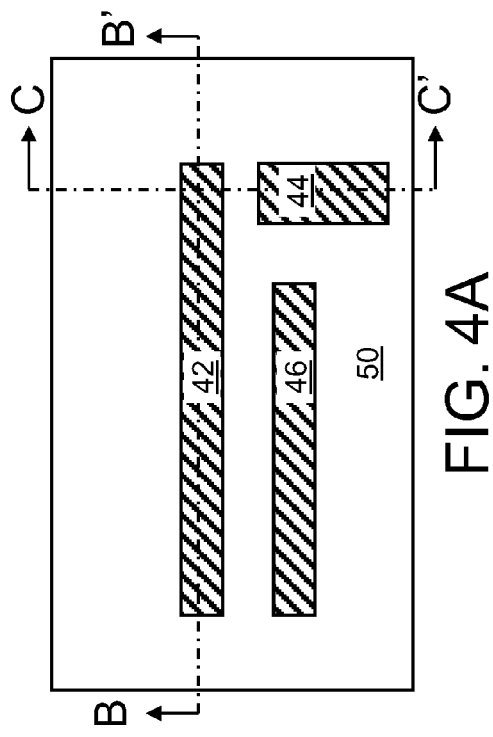
Figure 4C:
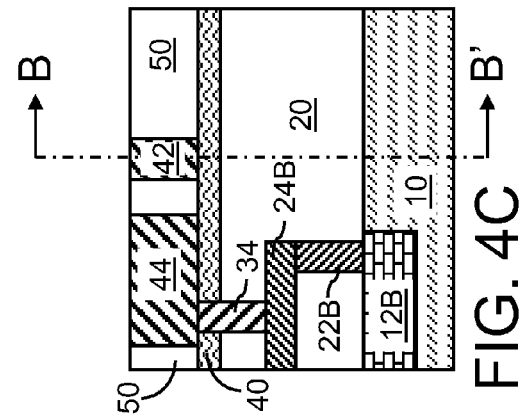
Figure 4B:
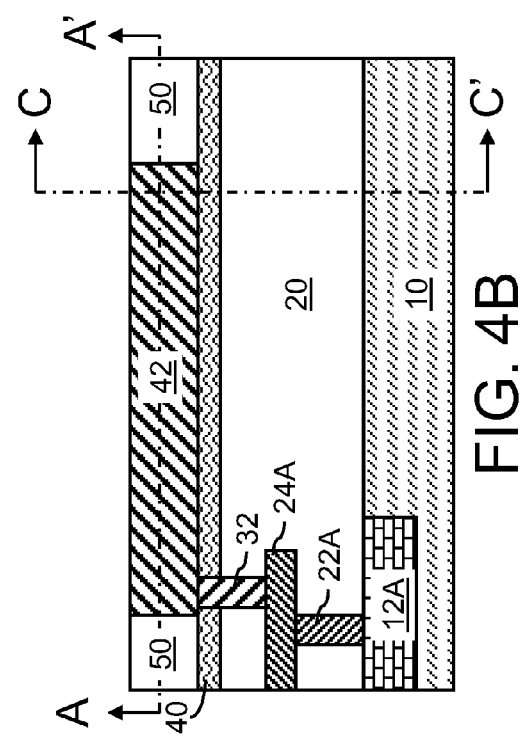
Figure 5A:
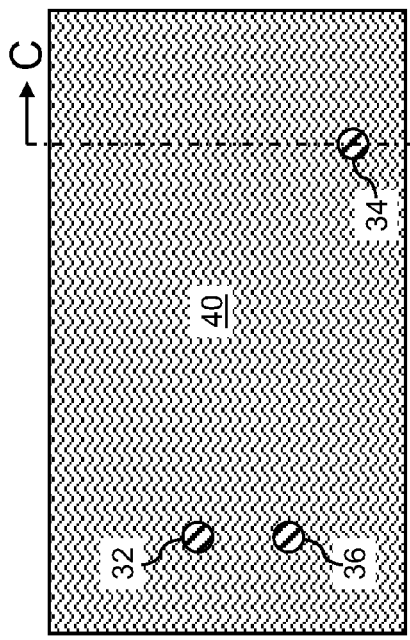
Figure 5B:
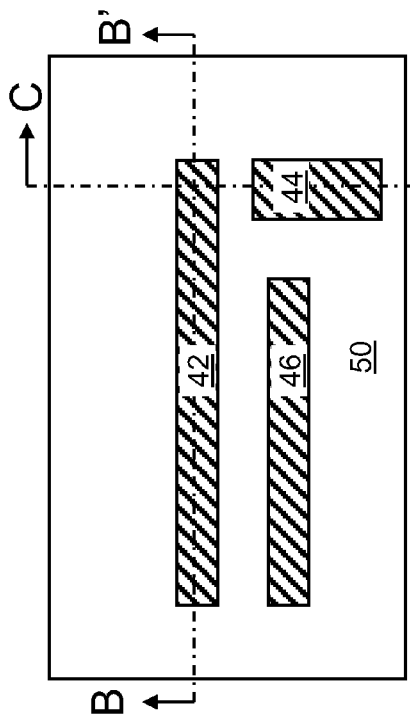
Figure 5D:
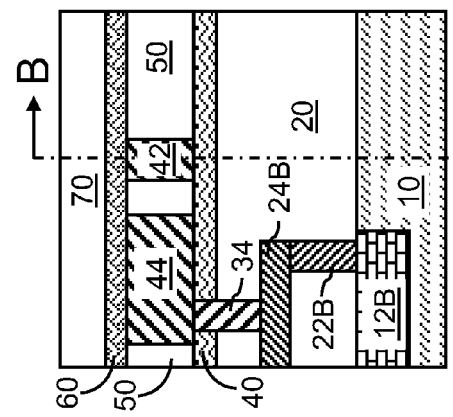
Figure 5C:
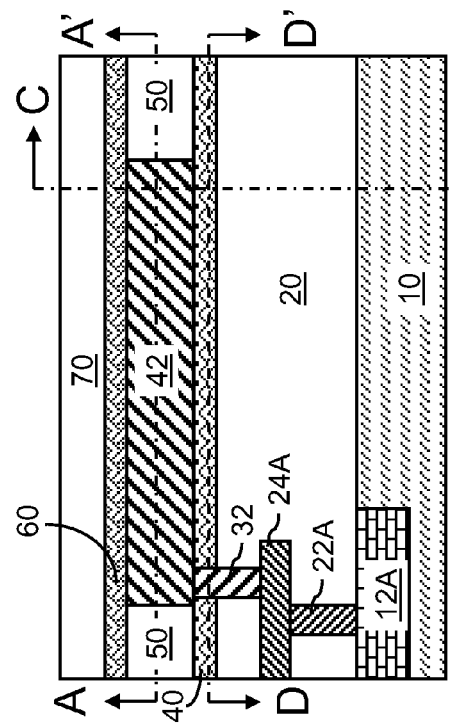
Figure 7E:
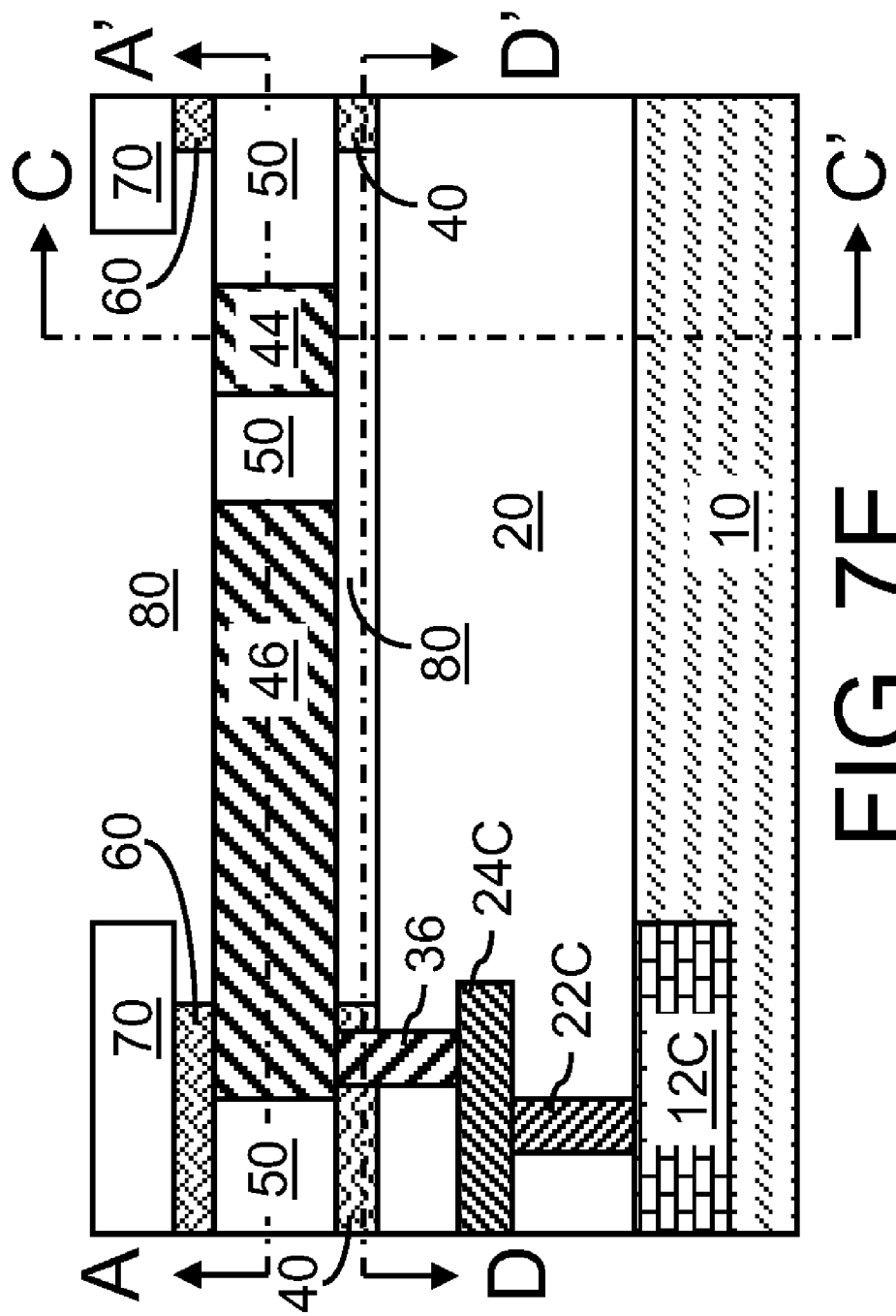
" FIG. 7E is a vertical cross-sectional view of the first exemplary structure along the plane E-E' in FIG. 7A.

Referring to FIGS. 4A-4C, a conductive material layer is deposited in the first, second, and third trenches (41, 43, 45), for example, by physical vapor deposition (PVD), chemical vapor deposition (CVD), electroplating, electroplating, or a combination thereof. The portion of the conductive material layer above the top surface of the second dielectric material layer 50 is removed, for example, by a recess etch, chemical mechanical planarization, or a combination thereof. The remaining portion of the conductive material layer in the first trench 41 constitutes a conductive cantilever 42. The remaining portion of the conductive material layer in the second trench 43 constitutes a conductive plate 44. The remaining portion of the conductive material layer in the third trench 45 constitutes a conductive actuator 46.

Each of the conductive cantilever 42, the conductive plate 44, and the conductive actuator 46 have a bottom surface that is substantially coplanar with the bottom surface of the second dielectric material layer 50 and a top surface that is substantially coplanar with the top surface of the second dielectric material layer 50. The conductive cantilever 42, the conductive plate 44, and the conductive actuator 46 comprise a conductive material, which may be a doped semiconductor material or a metallic material. The doped semiconductor material includes at least one electrical dopant such as B, Ga, In, P, As, and Sb. Exemplary doped semiconductor materials include, but are not limited to, doped polysilicon, doped germanium, a doped silicon-germanium alloy, a doped silicon carbon alloy, a doped silicon-germanium-carbon alloy, doped gallium arsenide, doped indium arsenide, doped indium phosphide, doped III-V compound semiconductor materials, doped II-VI compound semiconductor materials, doped organic semiconductor materials, and other doped compound semiconductor materials. The metallic material for the conductive cantilever 42, the conductive plate 44, and the conductive actuator 46 may be an elemental metal, an intermetallic alloy, a conductive metal nitride, a conductive metal oxide, or a combination thereof. For example, the metallic material the conductive cantilever 42, the conductive plate 44, and the conductive actuator 46 may be electroplated Cu, deposited Al, or deposited W including metallic liners.

Referring to FIGS. 5A-5D, a third dielectric material layer 60 and a dielectric capping layer 70 may be formed on the top surfaces of the second dielectric material layer 50, the conductive cantilever 42, the conductive plate 44, and the conductive actuator 46. The stack of the third dielectric material layer 60 and the dielectric capping layer 70 is optional, i.e., may, or may not be formed. Preferably, if the dielectric capping layer 70 is formed, the third dielectric material layer 60 is also formed.

The third dielectric material layer 60 comprises a different material than the dielectric material of the second dielectric material layer 50. The third dielectric material layer 60 comprises a material that may be removed selective to the material of dielectric capping layer 70 and the second dielectric material layer 50.

In one case the third dielectric material layer 60 comprises a polymer material that may be employed for the first dielectric material layer 40 as described above. The material of the third dielectric material layer 60 may be porous or non-porous. The material of the third dielectric material layer 60 may be the same as, or may be different from, the material of the first dielectric material layer 40. In another case, the first dielectric material layer 40 comprises a dielectric material selected from an organosilicate glass (OSG), a spin-on glass (SOG) material, a silicon oxide, and a silicon nitride.

The thickness of the third dielectric material layer 60 may be from about 0.2 μm to about 100 μm, and typically from about 2 μm to about 20 μm, although lesser and greater thicknesses are also contemplated herein.

The dielectric capping layer 70 comprises a different dielectric material than the material of the third dielectric layer 60. For example, the dielectric capping layer 70 may comprise one of an organosilicate glass (OSG), a spin-on glass (SOG) material, a silicon oxide, and a silicon nitride. The dielectric capping layer 70 may comprise the same material as, or a different material from, the material of the second dielectric material layer 50. The material of the dielectric capping layer 70 is selected such that a subsequent isotropic etch that is employed to remove portions of the first and third dielectric material layers (40, 60) is selective to the material of the dielectric capping layer 70. The thickness of the dielectric capping layer 70 may be from about 0.2 μm to about 100 μm, and typically from about 2 μm to about 20 μm, although lesser and greater thicknesses are also contemplated herein.

Referring to FIGS. 6A-6D, a second masking layer 77 is formed over the second dielectric material layer 50 and lithographically patterned to form an openings. The second masking layer 77 is formed directly on the dielectric capping layer 70 if a stack of the dielectric capping layer 70 and the third dielectric material layer 60 are present. Alternately, in the absence of a stack of the dielectric capping layer 70 and the third dielectric material layer 60, the second masking layer 77 is formed directly on the top surface of the second dielectric material layer 50. The second masking layer 77 may be a soft mask such as a photoresist layer, or may be a hard mask comprising a dielectric material. In case the second masking layer 77 is a hard mask, the material of the second masking layer 77 is different from the materials of the first and second dielectric material layers (40, 50) to enable selective removal of the second masking layer 77 relative to the first and second dielectric material layers (40, 50). In this case, the material of the hard mask may, or may not, be different from the material of the third dielectric material layer 60 and/or the material of the dielectric capping layer 70.

The opening in the second masking layer 77 overlies a center portion and an end portion of the conductive cantilever 42 and a portion of the conductive actuator 44 that includes a sidewall of the conductive actuator 46 that is proximal to the conductive cantilever 42. The opening in the second masking layer 77 may, or may not, overlie an end portion of the conductive plate 44 that is proximal to the conductive cantilever 42. The opening in the second masking layer 77 does not overlie the other end portion of the conductive cantilever 42 or a sidewall of the conductive actuator 46 that distal from the conductive cantilever 42.

The pattern in the second masking layer 77 is transferred into the dielectric capping layer 70, the third dielectric material layer 60, the second dielectric material layer 50, and the first dielectric material layer 40 by an etch that employs the second masking layer 77 as an etch mask. In a preferred case, the etch is an anisotropic etch such as a reactive ion etch (RIE), although an isotropic etch such as a wet etch is also contemplated herein. The etch is selective to the conductive cantilever 42, the conductive plate 44, and the conductive actuator 46. The etch may, or may not, be selective to the at least one interconnect-level dielectric layer 20. Preferably, the etch is selective to the at least one interconnect-level dielectric layer 20. A cavity 80 is formed in the first, second, third dielectric material layers (40, 50, 60) and the dielectric capping layer 70.

In case an anisotropic etch is employed to form the cavity 80, the sidewalls of the second masking layer 77, the sidewalls of the dielectric capping layer 70, and the sidewalls of the third dielectric material layer 60 are substantially vertically coincident. Sidewalls of the second dielectric material layer 50 are also substantially vertically coincident with the sidewalls of the second masking layer 77. Portions of the first dielectric material layer 40 are protected from the etch by the exposed portions of the conductive cantilever 42, the conductive plate 44, and the conductive actuator 46. Thus, sidewalls of the first dielectric material layer 40 are substantially vertically coincident with the sidewalls of the second dielectric material layer 50 and the sidewalls of the conductive cantilever 42, the conductive plate 44, and the conductive actuator 46.

Referring to FIGS. 7A-7E, the first dielectric material layer 40 is laterally etched selective to the second dielectric material layer 50. The lateral recess of the second dielectric material layer 50 proceeds the portion of the first dielectric material layer underneath a center portion and an end portion of the conductive cantilever 42 within the cavity 80 is completely removed so that the bottom surface of the conductive cantilever 42 is exposed. In case the second masking layer 77 is a soft mask, the second masking layer 77 is removed selective to the second dielectric layer 50 and the dielectric capping layer 70. In case the second masking layer 77 is a hard mask, the second masking layer 77 may be removed selective to the second dielectric layer 50 and the dielectric capping layer 70 or may be left above the third dielectric material layer 60 without removal.

The conductive cantilever 42 has a fixed end 142 that is embedded in the second dielectric material layer 50, a free end 144 that is free to move under an externally applied force, and a conductive cantilever sidewall 342. The conductive plate 44 is embedded in the second dielectric material layer 50, is located in proximity to the free end 242 of the conductive cantilever 42, and includes a conductive plate sidewall 144. The conductive actuator 46 is embedded in the second dielectric material layer 50 and is laterally displaced from the conductive cantilever 42 and the conductive plate 46. The free end 242 of the conductive cantilever 42 is laterally flexible to enable mechanical contact with the conductive plate 44 under electrical bias applied across the conductive actuator 46 and the conductive cantilever 42.

The conductive cantilever sidewall 342 is located between the fixed end 142 and the free end 242 of the conductive cantilever 42. The conductive cantilever sidewall 342 has a substantially vertical surface and faces the conductive cantilever sidewall 144. The conductive actuator 46 includes a conductive actuator sidewall 146 having a substantially vertical surface. The conductive cantilever 42 forms a mechanical contact with the conductive plate sidewall 144 by laterally flexing under the electrical bias.

The conductive cantilever 42 vertically abuts a top surface of the first conductive via structure 32, and is electrically connected to the first semiconductor device 12A. The conductive plate 44 vertically abuts a top surface of the second conductive via structure 34, and is electrically connected to the second semiconductor device 12B. The conductive actuator 46 vertically abuts a top surface of the third conductive via structure 36. The conductive actuator 46 is electrically connected to the third semiconductor device 12C through the third metal interconnect structure, which includes the third conductive via structure 36, the at least one third metal interconnect line structure 24C, and the at least one third metal interconnect via structure 22C. The conductive cantilever 42, the conductive plate 44, and the conductive actuator 46 are resistively connected to the first, second, and third semiconductor devices (12A, 12B, 12C).

In case the first and second semiconductor devices (12A, 12B) comprise a radio frequency (RF) signal processing circuitry and the third semiconductor device 12C generates a switching control signal which is applied to the conductive actuator 46, the conductive cantilever 42, the conductive plate 44, and the conductive actuator constitute a micro-electro-mechanical-system (MEMS) switch for electrically connecting or disconnecting a signal path between the first and second semiconductor devices (12A, 12B).

Referring to FIGS. 8A-8D, a second exemplary structure according to a second embodiment of the present invention is shown. The second exemplary structure is derived from the first exemplary structure by omitting the processing steps corresponding to formation of the third dielectric material layer 60 and the dielectric capping layer 70. In this case, the second masking layer 77 (See FIGS. 6A-6D) is formed directly on the top surfaces of the second dielectric material layer 50, the conductive cantilever 42, the conductive plate 44, and the conductive actuator 46. The second masking layer 77 may be removed or left on the top surface of the second dielectric material layer 50.

Figure 9A:
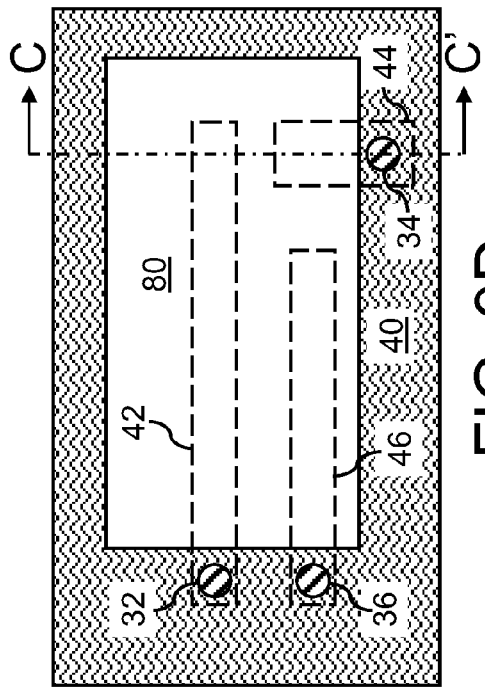
FIGS. 9A-9D are various views of a third exemplary structure according to a third embodiment of the present invention.
Figure 9C:
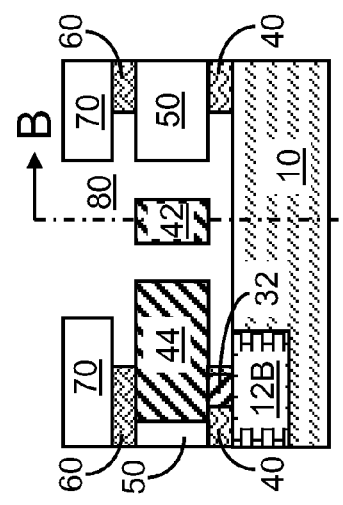
Figure 9D:
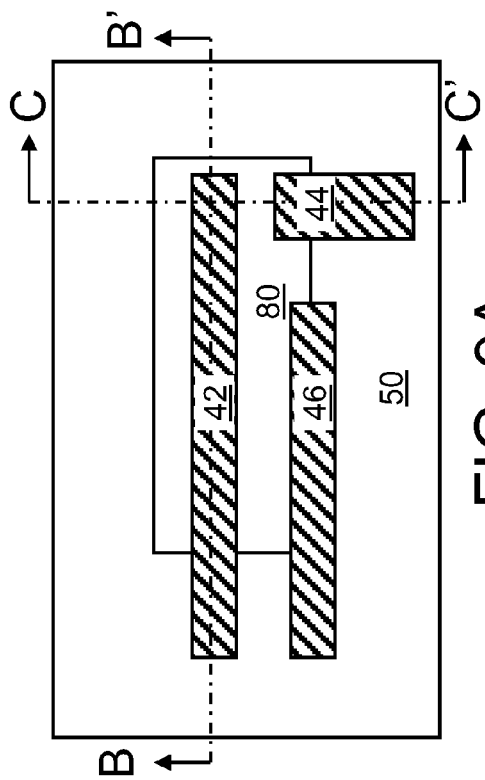
Figure 9B:
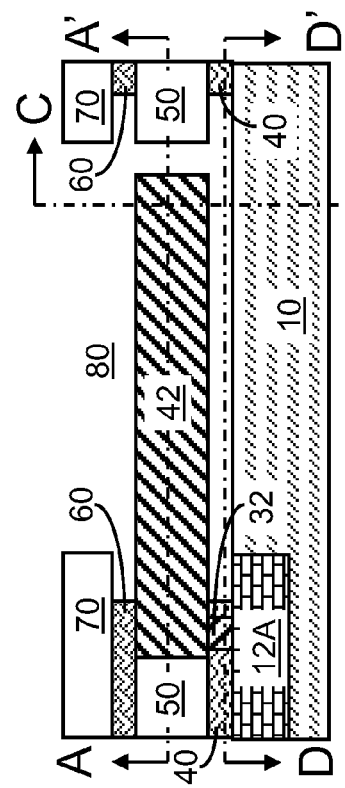
Figure 10:
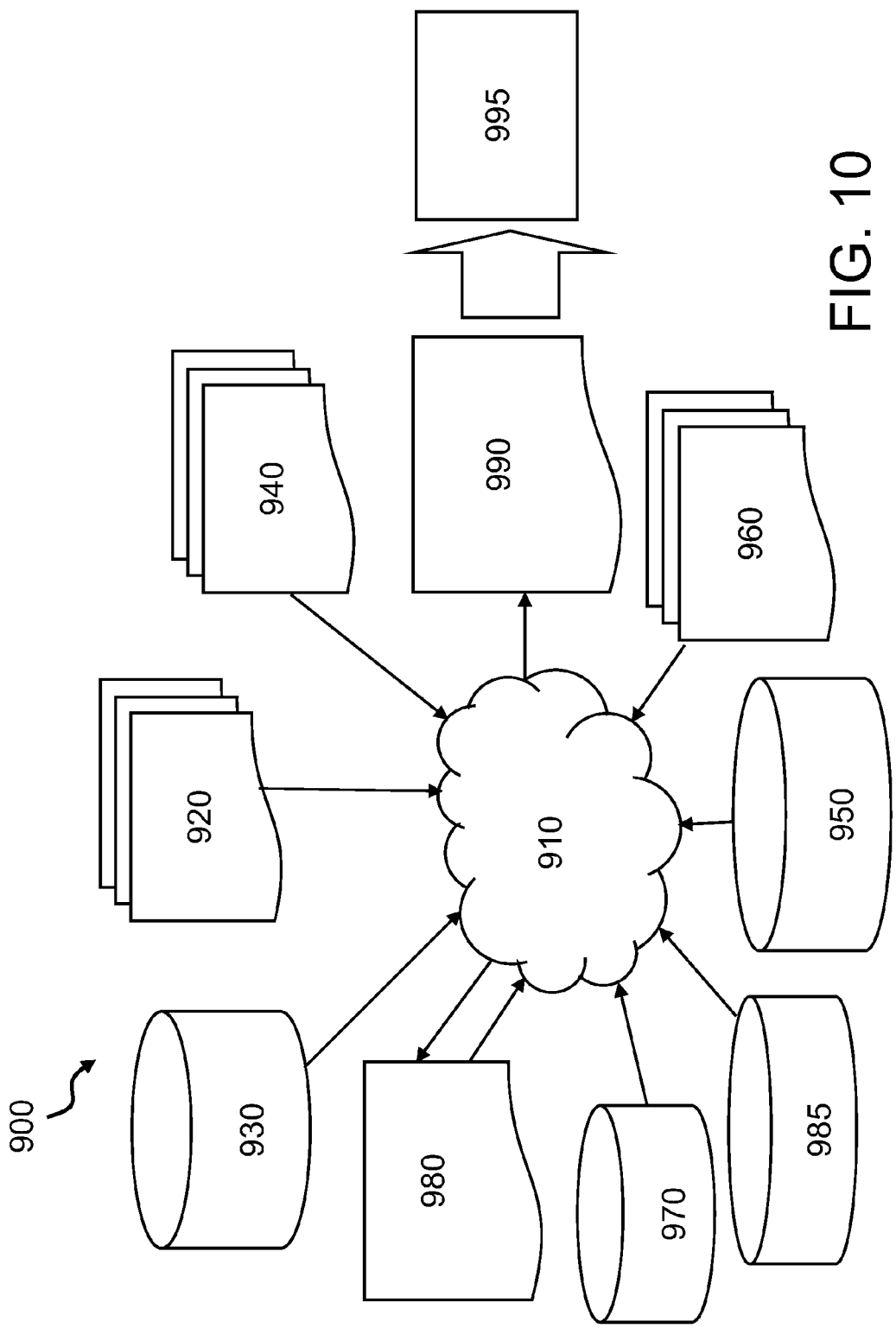
FIG. 10 is a flow diagram of a design process that may be used in design and manufacture of the semiconductor circuits according to the present invention.

Referring to FIGS. 9A-9B, a third exemplary structure according to a third embodiment of the present invention is shown. The third exemplary structure is derived from the first exemplary structure by omitting the processing steps for formation of the at least one interconnect-level dielectric layer 20 (See FIGS. 1A-1C), the various metal interconnect via structures (22A, 22B, 22C), and the various metal interconnect line structures (24A, 24B, 24C). The first dielectric material layer 40 is formed directly on the top surface of the semiconductor substrate 10. The first conductive via structure 32 abuts the first semiconductor device 12A and the conductive cantilever 42. The second conductive via structure 34 abuts the second semiconductor device 12B and the conductive plate 44. The third conductive via structure 36 abuts the third semiconductor device (not shown) and the conductive actuator 46.

FIG. 15 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-14. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 15 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-14. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-14 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 990 may comprise a compiled, executable HDL simulation model that functionally simulates the devices shown in FIGS. 1-14.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-14. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a micro-electrical-mechanical-system (MEMS) switch comprising:
forming a first dielectric material layer on a substrate;
forming a second dielectric material layer directly on a top surface of said first dielectric material layer;
forming a conductive cantilever, a conductive plate, and a conductive actuator within said second dielectric layer;
forming a masking layer including a pattern of a hole therein over said second dielectric material layer;
transferring said pattern in said masking layer into said second dielectric material layer and said first dielectric material layer; and
laterally etching said first dielectric material layer from underneath a portion of said conductive cantilever, wherein said conductive cantilever has a fixed end that is embedded in said second dielectric material layer, a free end that is free to move under an externally applied force, and a conductive cantilever sidewall, wherein said conductive plate is embedded in said second dielectric material layer, is located in proximity to said free end of said conductive cantilever, and includes a conductive plate sidewall, and wherein said conductive actuator is embedded in said second dielectric material layer and is laterally displaced from said conductive cantilever and said conductive plate, wherein said free end of said conductive cantilever is laterally flexible to enable mechanical contact with said conductive plate under electrical bias applied across said conductive actuator and said conductive cantilever.

2. The method of claim 1, wherein said second hole overlies said first hole, wherein said second dielectric material layer comprises a different material than said first dielectric material layer.

3. The method of claim 1, wherein said substrate is a semiconductor substrate, and wherein said method further comprises forming first, second, and third semiconductor devices on said semiconductor substrate, wherein said first semiconductor device is electrically connected to said conductive cantilever, wherein said second semiconductor device is electrically connected to said conductive plate, and wherein said third semiconductor device is electrically connected to said conductive actuator.

4. The method of claim 3, further comprising forming first, second, and third conductive via structures in said first dielectric material layer, wherein said conductive cantilever is formed directly on said first conductive via structure, wherein said conductive plate is formed directly on said second conductive via structure, and wherein said conductive actuator is formed directly on said third conductive via structure.

5. The method of claim 4, further comprising:
forming at least one interconnect-level dielectric layer directly on said semiconductor substrate, wherein said first dielectric material layer is formed above said at least one interconnect-level dielectric layer; and
forming first, second, and third metal interconnect structures in said at least one interconnect-level dielectric layer and said first semiconductor layer, wherein said first metal interconnect structure includes said first conductive via and abuts said first semiconductor device, wherein said second metal interconnect structure includes said second conductive via and abuts said second semiconductor device, and wherein said third metal interconnect structure includes said third conductive via and abuts said third semiconductor device.

6. The method of claim 1, wherein each of said conductive cantilever, said conductive plate, and said conductive actuator has a top surface that is substantially coplanar with a top surface of said second dielectric material layer, and wherein each of said conductive cantilever, said conductive plate, and said conductive actuator has a bottom surface that is substantially coplanar with a bottom surface of said second dielectric material layer.

7. The method of claim 1, further comprising laterally etching said first dielectric material layer selective to said second dielectric material layer, said conductive cantilever, said conductive plate, and said conductive actuator, wherein said second dielectric material layer is removed from said conductive cantilever.

8. A method of operating a micro-electrical-mechanical-system (MEMS) switch, said method comprising:
providing a micro-electrical-mechanical-system (MEMS) switch comprising:
a first dielectric material layer including a first hole therein and located on a substrate;
a second dielectric material layer including a second hole therein and located directly on a top surface of said first dielectric material layer;
a conductive cantilever having a fixed end that is embedded in said second dielectric material layer, a free end that is free to move under an externally applied force, and a conductive cantilever sidewall;
a conductive plate embedded in said second dielectric material layer and located in proximity to said free end of said conductive cantilever and including a conductive plate sidewall; and
a conductive actuator embedded in said second dielectric material layer and laterally displaced from said conductive cantilever and said conductive plate; and
applying a voltage bias across said conductive actuator and said conductive cantilever, wherein, wherein said free end of said conductive cantilever is laterally flexed to form a mechanical contact with said conductive plate.

9. The method of claim 8, wherein said second hole overlies said first hole, wherein said second dielectric material layer comprises a different material than said first dielectric material layer, wherein said conductive cantilever sidewall is located between said fixed end and said free end and has a substantially vertical surface and faces said conductive cantilever sidewall and has a substantially vertical surface, wherein said conductive actuator includes a conductive actuator sidewall having a substantially vertical surface, and wherein said conductive cantilever directly contacts said conductive plate sidewall under said electrical bias.

10. The method of claim 8, wherein said substrate is a semiconductor substrate including a first semiconductor device, a second semiconductor device, and a third semiconductor device, and wherein said structure further comprises:
at least one interconnect-level dielectric layer located directly on said semiconductor substrate and directly beneath said first dielectric material layer;
a first metal interconnect structure embedded in said at least one interconnect-level dielectric layer and abutting said first semiconductor device and said conductive cantilever;
a second metal interconnect structure embedded in said at least one interconnect-level dielectric layer and abutting said second semiconductor device and said conductive plate; and a third metal interconnect structure embedded in said at least one interconnect-level dielectric layer and abutting said third semiconductor device and said conductive actuator.

11. A structure comprising:
a first dielectric material layer including a first hole therein and located on a substrate;
a second dielectric material layer including a second hole therein and located directly on a top surface of said first dielectric material layer;
a conductive cantilever having a fixed end that is embedded in said second dielectric material layer, a free end that is free to move under an externally applied force, and a conductive cantilever sidewall;
a conductive plate embedded in said second dielectric material layer and located in proximity to said free end of said conductive cantilever and including a conductive plate sidewall; and
a conductive actuator embedded in said second dielectric material layer and laterally displaced from said conductive cantilever and said conductive plate, wherein said free end of said conductive cantilever is laterally flexible to enable mechanical contact with said conductive plate under electrical bias applied across said conductive actuator and said conductive cantilever.

12. The structure of claim 11, wherein said second hole overlies said first hole, wherein said second dielectric material layer comprises a different material than said first dielectric material layer, wherein said conductive cantilever sidewall is located between said fixed end and said free end and has a substantially vertical surface and faces said conductive cantilever sidewall, wherein said conductive actuator includes a conductive actuator sidewall having a substantially vertical surface, and wherein said conductive cantilever directly contacts said conductive plate sidewall under said electrical bias.

13. The structure of claim 12, wherein said substrate is a semiconductor substrate including a first semiconductor device electrically connected to said conductive cantilever and a second semiconductor device electrically connected to said conductive plate.

14. The structure of claim 13, wherein said semiconductor substrate includes a single crystalline semiconductor layer, wherein said first semiconductor device and said second semiconductor device are located directly on, or in, said single crystalline semiconductor layer.

15. The structure of claim 13, further comprising:
at least one interconnect-level dielectric layer located directly on said semiconductor substrate and directly beneath said first dielectric material layer;
a first metal interconnect structure embedded in said at least one interconnect-level dielectric layer and abutting said first semiconductor device and said conductive cantilever; and
a second metal interconnect structure embedded in said at least one interconnect-level dielectric layer and abutting said second semiconductor device and said conductive plate.

16. The structure of claim 15, wherein said first metal interconnect structure includes a first conductive via structure vertically abutting said conductive cantilever and a second conductive via structure vertically abutting said conductive plate, wherein said first dielectric material layer laterally surrounds an upper portion of said first conductive via structure and an upper portion of said second conductive via structure.

17. The structure of claim 15, further comprising:
a third semiconductor device electrically connected to said conductive actuator; and
a third metal interconnect structure embedded in said at least one interconnect-level dielectric layer and abutting said third semiconductor device and said conductive actuator.

18. The structure of claim 17, wherein said third metal interconnect structure includes a third conductive via structure vertically abutting said conductive activator, wherein said first dielectric material layer laterally surrounds an upper portion of said third conductive via structure.

19. The structure of claim 11, wherein each of said conductive cantilever, said conductive plate, and said conductive actuator has a top surface that is substantially coplanar with a top surface of said second dielectric material layer, and wherein each of said conductive cantilever, said conductive plate, and said conductive actuator has a bottom surface that is substantially coplanar with a bottom surface of said second dielectric material layer.

20. The structure of claim 11, wherein said first dielectric material layer comprises a polymer material and said second dielectric material layer comprises a non-polymer material.

21. The structure of claim 11, further comprising a third dielectric material layer located directly on said second dielectric material layer and including a third hole, wherein said third hole overlies an entirety of said second hole and includes an additional area located outside an area of said second hole.

22. A design structure embodied in a machine readable medium for designing, manufacturing, or testing a design for a semiconductor structure, said design structure comprising:
a first data representing a substrate;
a second data representing a first dielectric material layer including a first hole therein and located on said substrate;
a third data representing a second dielectric material layer including a second hole therein and located directly on a top surface of said first dielectric material layer;
a fourth data representing a conductive cantilever having a fixed end that is embedded in said second dielectric material layer, a free end that is free to move under an externally applied force, and a conductive cantilever sidewall;
a fifth data representing a conductive plate embedded in said second dielectric material layer and located in proximity to said free end of said conductive cantilever and having a conductive plate sidewall facing said conductive cantilever sidewall including a conductive plate sidewall having a substantially vertical surface; and
a sixth representing a conductive actuator embedded in said second dielectric material layer, laterally displaced from said conductive cantilever and said conductive plate, and including a conductive actuator sidewall having a substantially vertical surface, wherein said free end of said conductive cantilever is laterally flexible to enable mechanical contact with said conductive plate sidewall under electrical bias applied across said conductive actuator and said conductive cantilever.

23. The design structure of claim 22, further comprising:
a seventh data representing a first semiconductor device electrically connected to said conductive cantilever; and
an eighth data representing a second semiconductor device electrically connected to said conductive plate, wherein said first data represents a semiconductor substrate on which said first semiconductor device and said second semiconductor device are located.

24. The design structure of claim 23, further comprising:
a ninth data representing a third semiconductor device electrically connected to said conductive actuator;
a tenth data representing a first metal interconnect structure embedded in said at least one interconnect-level dielectric layer and abutting said first semiconductor device and said conductive cantilever;
an eleventh data representing a second metal interconnect structure embedded in said at least interconnect-level dielectric layer and abutting said second semiconductor device and said conductive plate; and
a twelfth data representing a third metal interconnect structure embedded in said at least one interconnect-level dielectric layer and abutting said third semiconductor device and said conductive actuator.

25. The design structure of claim 22, further comprising:
an additional data representing a third dielectric material layer located directly on said second dielectric material layer and including a third hole, wherein said third hole overlies an entirety of said second hole and includes an additional area located outside an area of said second hole; and
another additional data representing a dielectric capping layer comprising a different dielectric material than said first and third dielectric material layers and including a fourth hole having a periphery that is substantially vertically coincident with a periphery of said second hole.

* * * * *